(12) United States Patent
Takahashi

(10) Patent No.: US 6,921,016 B2
(45) Date of Patent: Jul. 26, 2005

(54) SEMICONDUCTOR DEVICE AND METHOD OF MANUFACTURING THE SAME, CIRCUIT BOARD, AND ELECTRONIC EQUIPMENT

(75) Inventor: Takuya Takahashi, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/347,297

(22) Filed: Jan. 21, 2003

(65) Prior Publication Data

US 2003/0155405 A1 Aug. 21, 2003

(30) Foreign Application Priority Data

Feb. 19, 2002 (JP) ........................................ 2002-041679

(51) Int. Cl.⁷ .............................................. B23K 31/00
(52) U.S. Cl. .................................. 228/180.5; 228/110.1
(58) Field of Search ............................... 228/180.5, 155, 228/180.22, 4.5; 156/73.2, 580.1, 580.2; 257/784, 786; 29/872, 873, 740, 748

(56) References Cited

U.S. PATENT DOCUMENTS 3,643,321 A * 2/1972 Field et al. ............... 228/180.5
5,111,989 A * 5/1992 Holdgrafer et al. ...... 228/110.1
6,079,610 A * 6/2000 Maeda et al. ............. 228/180.5
6,215,182 B1 * 4/2001 Ozawa et al. ................ 257/723
6,244,499 B1 * 6/2001 Tsai et al. ................. 228/180.5
6,260,753 B1 * 7/2001 Renard et al. ............... 228/155

FOREIGN PATENT DOCUMENTS

| JP | A-10-112471 | 4/1998 |
| JP | A-2001-284388 | 10/2001 |
| JP | A-2002-280410 | 9/2002 |

OTHER PUBLICATIONS

U.S. Appl. No. 10/327,968, filed Dec. 26, 2002, Tomimatsu.
U.S. Appl. No. 10/347,299, filed Jan. 21, 2003, Takahashi et al.
U.S. Appl. No. 10/347,947, filed Jan. 21, 2003, Takahashi.

* cited by examiner

*Primary Examiner*—Jonathan Johnson
(74) *Attorney, Agent, or Firm*—Oliff & Berridge, PLC

(57) ABSTRACT

A tip of a wire is bonded to a first electrode by using a tool. The wire is drawn from the first electrode to a bump on a second electrode. Apart of the wire is bonded to the center of the bump or a portion of the bump beyond the center in a drawing direction of the wire by using a part of the tool on a first electrode side in the drawing direction of the wire.

15 Claims, 14 Drawing Sheets

SEMICONDUCTOR DEVICE AND METHOD OF MANUFACTURING THE SAME, CIRCUIT BOARD, AND ELECTRONIC EQUIPMENT

Japanese Patent Application No. 2002-41679 filed on Feb. 19, 2002, is hereby incorporated by reference in its entirety.

BACKGROUND OF THE INVENTION

The present invention relates to a semiconductor device and a method of manufacturing the same, a circuit board, and electronic equipment.

In the manufacture of semiconductor devices, a method of performing second bonding of a wire to a bump on an electrode is known. According to this method, since the loop height of the wire is decreased, a thin semiconductor device can be manufactured. In the case of connecting the wire to the bump, it is important to sufficiently secure a junction region between the wire and the bump so that the wire and the bump are joined in a reliable and stable state.

BRIEF SUMMARY OF THE INVENTION

A method of manufacturing a semiconductor device according to an aspect of the present invention includes steps of:

(a) bonding a tip of a wire to a first electrode by using a tool;

(b) drawing the wire from the first electrode to a bump on a second electrode; and (c) bonding a part of the wire to a center of the bump or a portion of the bump beyond the center along a drawing direction of the wire by using a part of the tool on a first electrode side.

A semiconductor device according to another aspect of the present invention is manufactured by using the above method.

A semiconductor device according to a further aspect of the present invention includes:

a lead having a part which becomes a first electrode;

a semiconductor chip which includes an integrated circuit, a second electrode, and a bump having a bottom end connected with the second electrode and a top end having an almost smooth surface; and a wire which has first and second ends, the first end being electrically connected with the first electrode and the second end being electrically connected with the bump, wherein the top end of the bump is formed so that a width of the top end is elongated in a drawing direction of the wire toward the bump and a height of the top end decreases as a distance from the wire increases along the drawing direction of the wire, and wherein the second end of the wire is connected with a center of the bump or a portion of the bump beyond the center along the drawing direction of the wire.

A semiconductor device according to a still further aspect of the present invention includes:

a semiconductor chip which includes an integrated circuit and a first electrode;

another semiconductor chip which includes an integrated circuit, a second electrode, and a bump having a bottom end connected with the second electrode and a top end having an almost smooth surface; and a wire which has first and second ends, the first end being electrically connected with the first electrode and the second end being electrically connected with the bump, wherein the top end of the bump is formed so that a width of the top end is elongated in a drawing direction of the wire toward the bump and a height of the top end decreases as a distance from the wire increases along the drawing direction of the wire, and wherein the second end of the wire is bonded to a center of the bump or a portion of the bump beyond the center along the drawing direction of the wire.

A circuit board according to an even further aspect of the present invention has the above semiconductor device mounted on the circuit board.

Electronic equipment according to a yet further aspect of the present invention includes the above semiconductor device.

DETAILED DESCRIPTION OF THE EMBODIMENT

Figure 1A:
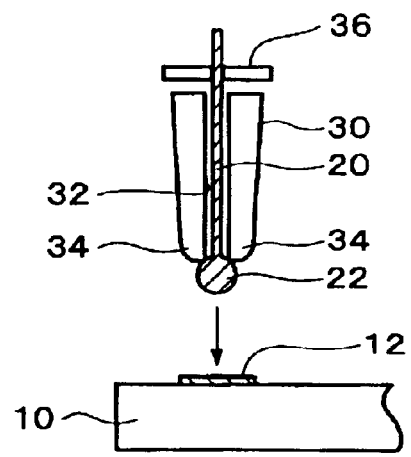
FIGS. 1A to 1C illustrate a method for forming a bump and a method of manufacturing a semiconductor element having bumps according to a first embodiment of the present invention.

An embodiment of the present invention may bond a wire to a bump in a reliable and stable state.

(1) A method of manufacturing a semiconductor device according to an embodiment of the present invention includes steps of:

(a) bonding a tip of a wire to a first electrode by using a tool;

(b) drawing the wire from the first electrode to a bump on a second electrode; and (c) bonding a part of the wire to a center of the bump or a portion of the bump beyond the center along a drawing direction of the wire by using a part of the tool on a first electrode side.

According to this embodiment of the present invention, a part of the wire is bonded to the center of the bump in the drawing direction of the wire or a portion of the bump beyond the center. This enables a part of the wire which projects from the bump toward the first electrode to be prevented from being pressed by the tool, for example. This prevents the wire from sagging. Therefore, the wire can be bonded to the bump in a reliable and stable state.

(2) In this method of manufacturing a semiconductor device, a part of the bump may be deformed by the tool in the step (c).

This enables the wire to be drawn up in the direction opposite to the electrode (upward direction) by using an undeformed part of the bump as a fulcrum. Therefore, the wire can be prevented from coming in contact with a member on which the electrode is formed.

(3) In this method of manufacturing a semiconductor device, the tool may be moved on the bump in a width direction of the bump while a part of the wire being pressed and deformed by the tool in the step (c).

According to this feature, the tool is moved in the width direction of the bump when applying pressure. This enables the bump to be formed in an optimum shape.

(4) In this method of manufacturing a semiconductor device, the tool may be moved on the bump in the drawing direction of the wire in the step (c).

This enables the width of the bump to be elongated in the drawing direction of the wire, or the height of the bump to be decreased along the drawing direction of the wire, for example.

(5) In this method of manufacturing a semiconductor device, the bump may be formed so that the width of the bump is elongated in the drawing direction of the wire in the step (c).

This enables another wire to be easily bonded to the bump, for example.

(6) In this method of manufacturing a semiconductor device, the bump may be formed so that a height of the bump decreases as a distance from the wire increases in the drawing direction of the wire in the step (c).

This enables another wire to be easily bonded to the bump, for example.

(7) In this method of manufacturing a semiconductor device, the step (c) may be performed while applying ultrasonic vibration to the bump.

This enables a continuous processing capability of the wire to be stabilized.

(8) In this method of manufacturing a semiconductor device, the tool may have a hole into which the wire is inserted, and a bonding step may be performed by using a part of an open end of the tool on the first electrode side in the step (c).

(9) This method of manufacturing a semiconductor device may further include, before the step (a), further comprising steps of:

(e) bonding a tip of a second wire formed in a shape of a ball to the second electrode;

(f) drawing a part of the second wire from the tip bonded to the second electrode;

(g) forming the bump on the second electrode by deforming the second wire at a portion continuous with the tip on the tip; and (h) cutting the second wire leaving the bump on the second electrode.

According to this feature, a bump having an almost smooth surface can be easily formed on the electrode.

(10) In this method of manufacturing a semiconductor device, the bump may be formed to have a bottom end connected with the second electrode and a top end having an almost smooth surface in the step (g).

(11) In this method of manufacturing a semiconductor device, the top end of the bump may be formed so that a width of the top end is elongated in the drawing direction of the wire to be connected with the bump toward the bump in the step (g).

This enables the wire to be easily bonded to the top end of the bump.

(12) In this method of manufacturing a semiconductor device, the top end of the bump may be formed so that a height of the top end decreases in a direction toward an outside of the semiconductor device in the step (g).

This enables the wire to be easily bonded to the top end of the bump.

(13) A semiconductor device according to another embodiment of the present invention is manufactured by the above method.

(14) A semiconductor device according to a further embodiment of the present invention includes:

a lead having a part which becomes a first electrode;

a semiconductor chip which includes an integrated circuit, a second electrode, and a bump having a bottom end connected with the second electrode and a top end having an almost smooth surface; and a wire which has first and second ends, the first end being electrically connected with the first electrode and the second end being electrically connected with the bump, wherein the top end of the bump is formed so that a width of the top end is elongated in a drawing direction of the wire toward the bump and a height of the top end decreases as a distance from the wire increases along the drawing direction of the wire, and wherein the second end of the wire is connected with a center of the bump or a portion of the bump beyond the center along the drawing direction of the wire.

According to this embodiment of the present invention, the width of the top end of the bump is elongated in the drawing direction of the wire toward the bump, and the height of the top end of the bump decreases along the drawing direction of the wire toward the bump. Therefore, the wire is easily bonded to the top end of the bump, whereby reliability of electrical connection between the wire and the bump increases.

Moreover, since the second end of the wire is connected with the center of the bump or a portion of the bump beyond the center in the drawing direction of the wire, a part of the wire which projects from the bump toward the first electrode can be prevented from sagging. Therefore, the wire can be electrically connected with the bump in a reliable and stable state.

(15) A semiconductor device according to a still further embodiment of the present invention includes:

a semiconductor chip which includes an integrated circuit and a first electrode;

another semiconductor chip which includes an integrated circuit, a second electrode, and a bump having a bottom end connected with the second electrode and a top end having an almost smooth surface; and a wire which has first and second ends, the first end being electrically connected with the first electrode and the second end being electrically connected with the bump, wherein the top end of the bump is formed so that a width of the top end is elongated in a drawing direction of the wire toward the bump and a height of the top end decreases as a distance from the wire increases along the drawing direction of the wire, and wherein the second end of the wire is bonded to a center of the bump or a portion of the bump beyond the center along the drawing direction of the wire.

According to this embodiment of the present invention, the width of the top end of the bump is elongated in the drawing direction of the wire toward the bump, and the height of the top end of the bump decreases along the drawing direction of the wire toward the bump. Therefore, the wire is easily bonded to the top end of the bump, whereby reliability of electrical connection between the wire and the bump increases.

Moreover, since the second end of the wire is connected with the center of the bump or a portion of the bump beyond the center in the drawing direction of the wire, a part of the wire which projects from the bump toward the first electrode can be prevented from sagging. Therefore, the wire can be electrically connected with the bump in a reliable and stable state.

(16) In this semiconductor device, a part of the bump may be deformed.

This enables the wire to be drawn up in the direction opposite to the electrode (upward direction) by using an undeformed part of the bump as a fulcrum. Therefore, the wire can be prevented from coming in contact with the semiconductor chip.

(17) A circuit board according to an even further embodiment of the present invention has the above semiconductor device mounted thereon.

(18) Electronic equipment according to a yet further embodiment of the present invention includes the above semiconductor device.

The embodiments of the present invention are described below with reference to the drawings. However, the present invention is not limited to these embodiments.

First Embodiment

FIGS. 1A to 1C, FIGS. 2A and 2B, and FIGS. 3 to 8 illustrate a semiconductor element having bumps and a method of manufacturing the same according to the present embodiment. In the present embodiment, a bump 40 is formed on an electrode 12 of a semiconductor element 10. The bump 40 is formed by bonding a wire 20 to the electrode 12 by using a tool 30. The bump 40 is used as a terminal for wire bonding.

The method of manufacturing a semiconductor element having bumps of the present embodiment includes a method for forming a bump shown in FIGS. 1A to 2B.

As shown in FIG. 1A, the semiconductor element 10 is provided. The semiconductor element 10 may be either a semiconductor wafer 14 (see FIG. 5) or a semiconductor chip 16 (see FIG. 6). Specifically, a bump formation process may be performed collectively in a wafer state or separately in a chip state. The semiconductor element 10 includes an integrated circuit. The semiconductor element 10 is generally formed in the shape of a rectangular parallelepiped (including a cube or a plate), for example. The integrated circuit is generally formed on one side (largest side, for example) of the semiconductor element 10.

The semiconductor element 10 has one or more electrodes 12. The electrode 12 is a pad thinly and smoothly formed on the side of the semiconductor element 10. The electrode 12 is formed on the side of the semiconductor element 10 on which the integrated circuit is formed. In this case, the electrode 12 may be formed outside the integrated circuit region. In the case of using the semiconductor chip 16, the electrode 12 is generally formed on the edge portion of the side (edge portions of two sides or four sides of the external shape, for example) of the semiconductor chip 16. In the case of using the semiconductor wafer 14, the electrode 12 is generally formed on the edge portion of a region 15 (edge portions of two sides or four sides of the region, for example) (see FIG. 5) including one integrated circuit of the semiconductor wafer 14. The electrode 12 is formed of an aluminum-based metal or a copper-based metal.

A passivation film (not shown) is formed on the semiconductor element 10 so as to avoid at least a part of each electrode 12. The passivation film may be formed of $SiO_2$, SiN, or a polyimide resin, for example.

As shown in FIG. 1A, the tool 30 which supports the wire 20 is provided. The wire 20 is formed of a conductive material such as gold. The tool 30 supports the wire 20 so that the axial direction of the wire 20 is perpendicular to the side of the electrode 12. In the example shown in FIG. 1A, the tool 30 has a hole 32. The wire 20 is inserted into the hole 32. The width (diameter) of the hole 32 is greater than the width (diameter) of the wire 20. Therefore, the wire 20 can be fed in the axial direction of the hole 32. The tool 30 may be a capillary used in the manufacture of a semiconductor device. The tool 30 may support the wire 20 by a guide means other than the hole. The tool 30 is supported on a main body (wire bonder) of a manufacturing apparatus (not shown) by means of a support (ultrasonic horn, for example) (not shown).

The wire 20 is held by a damper 36. The damper 36 is disposed above the tool 30, specifically, on the side opposite to the electrode 12. The wire 20 can be held by closing the clamper 36. The wire 20 can be handled by the tool 30 by opening the damper 36. In the example shown in FIG. 1A, the tool 30 and the damper 36 are formed separately. However, the tool 30 and the damper 36 may be formed integrally. For example, the tool 30 may have a function of the clamper 36.

A tip 22 of the wire 20 projects outside the opening of the hole 32 on the side of the electrode 12. An open end (or pressing section) 34 of the hole 32 is capable of pressing a part of the wire 20 (see FIGS. 1B, 2A, and 2B). A part (near the periphery of the tool) of the open end 34 may be sloped, as shown in the FIG. 1A. The open end 34 maybe a smooth surface.

As shown in FIG. 1A, the tool 30 is disposed on the side of the electrode 12 (above the electrode 12) of the semiconductor element 10. The tip 22 of the wire 20 is formed in the shape of a ball (or in the shape of a lump). The tip 22 may be formed in the shape of a ball by melting the tip 22 by applying thermal energy (such as discharge or gas flame). For example, an electric torch (not shown) may be allowed to approach the tip 22, and the tip 22 may be melted by high voltage discharge from the electric torch.

Figure 1B:
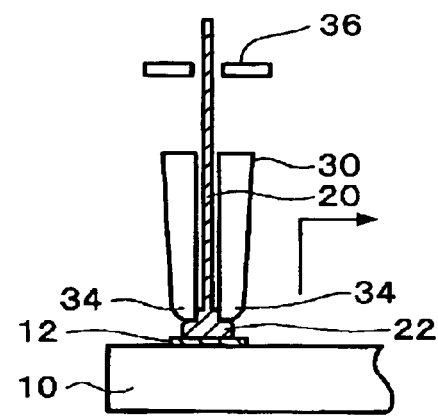

As shown in FIG. 1B, the tip 22 of the wire 20 is disposed above one of the electrodes 12. The tool 30 is brought down in a state in which the damper 36 is opened. The tip 22 of the wire 20 is bonded to the electrode 12 in this manner. In more detail, the tip 22 of the wire 20 is pressed by the open end 34 of the tool 30. It is preferable to apply ultrasonic vibration, heat, or the like while pressing the tip 22. This enables the tip 22 to be joined to the electrode 12 in a good state. A top end and a bottom end larger (wider) than the top end are formed at the tip 22 of the wire 20 by the pressure applied by the open end 34.

Figure 1C:
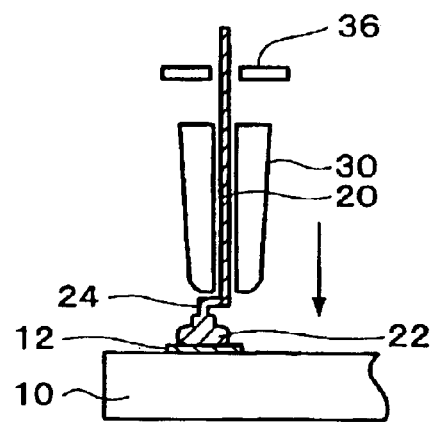

As shown in FIG. 1C, a part 24 of the wire 20 is drawn from the tip 22 bonded to the electrode 12. Since the tip 22 is joined to the electrode 12, the part 24 of the wire 20 can be drawn from the tip 22 by moving the tool 30 in a direction so as to be apart from the electrode 12.

In the example shown in FIG. 1C, the part 24 of the wire 20 is drawn from the tip 22 so that the part 24 is bent. This enables the wire 20 to be easily deformed at a portion continuous with the tip 22, on the tip 22. For example, the part 24 of the wire 20 may be bent by drawing the wire 20 above the electrode 12 by moving the tool 30 in a height direction of the tip 22, and then moving the tool 30 in a width direction of the tip 22. The form (shape, method, for example) of bending the part 24 of the wire 20 is not limited to the above-described example.

Figure 2A:
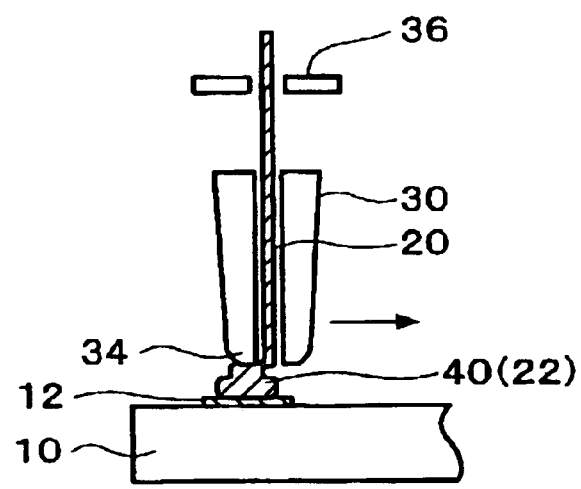
FIGS. 2A and 2B illustrate the method for forming a bump and the method of manufacturing a semiconductor element having bumps according to the first embodiment of the present invention.

As shown in FIG. 2A, a portion of the wire 20 continuous with the tip 22 is deformed by the tool 30. In more detail, at least a portion (part 24) continuous with the tip 22 of the wire 20 drawn from the tip 22 is deformed. As shown in FIG. 2A, the wire 20 may be deformed by a part of the open end 34 on one side of the hole 32 (part on the side opposite to the side to which the tool 30 is moved). On the tip 22, the wire 20 is deformed at a portion continuous with the tip 22, and becomes smooth. It is preferable to apply ultrasonic vibration when deforming a portion of the wire 20. Ultrasonic vibration is applied to the tip 22 through the tool 30. The bump 40 is formed on the electrode 12 in this manner. The bump 40 has a bottom end 44 connected with the electrode 12, and a top end 42 having an almost smooth surface (surface on which the projection of the wire is deformed) (see FIG. 4).

Figure 3:
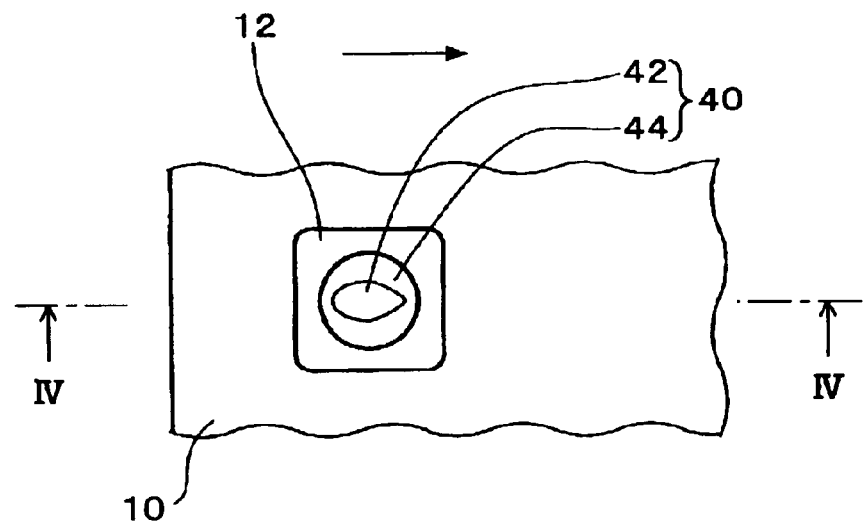
FIG. 3 illustrates a semiconductor element having bumps and a method of manufacturing the same according to the first embodiment of the present invention.
Figure 4:
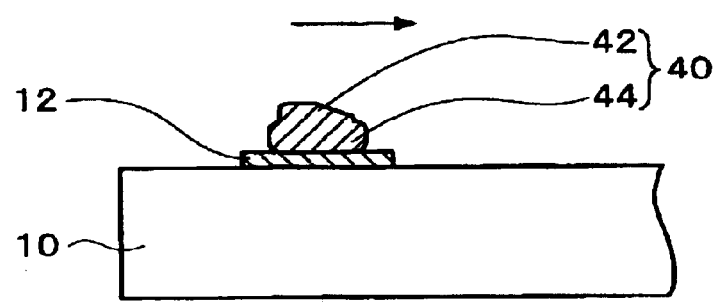
FIG. 4 is a cross-sectional view along the line VI—VI shown in FIG. 3.

In the example shown in FIG. 2A, the tool 30 is moved on the tip 22 in the width direction of the tip 22 (direction indicated by an arrow shown in FIG. 2A) while applying pressure to the tip 22. In other words, the tool 30 is slid in the direction parallel to the surface of the semiconductor element 10 while applying pressure to the tip 22. The bump 40 is formed in an optimum shape in this manner, as shown in FIGS. 3 and 4. FIG. 3 is a plan view of the semiconductor element after formation of the bump. FIG. 4 is a cross-sectional view along the line VI—VI shown in FIG. 3.

In the step of moving the tool 30 in the width direction of the tip 22 (direction indicated by the arrow shown in FIGS. 3 and 4), the width (length) of the top end 42 of the bump 40 may be elongated in the moving direction of the tool 30. In other words, the top end 42 of the bump 40 may be formed almost in the shape of an oval in a plan view of the bump 40.

Figure 7:
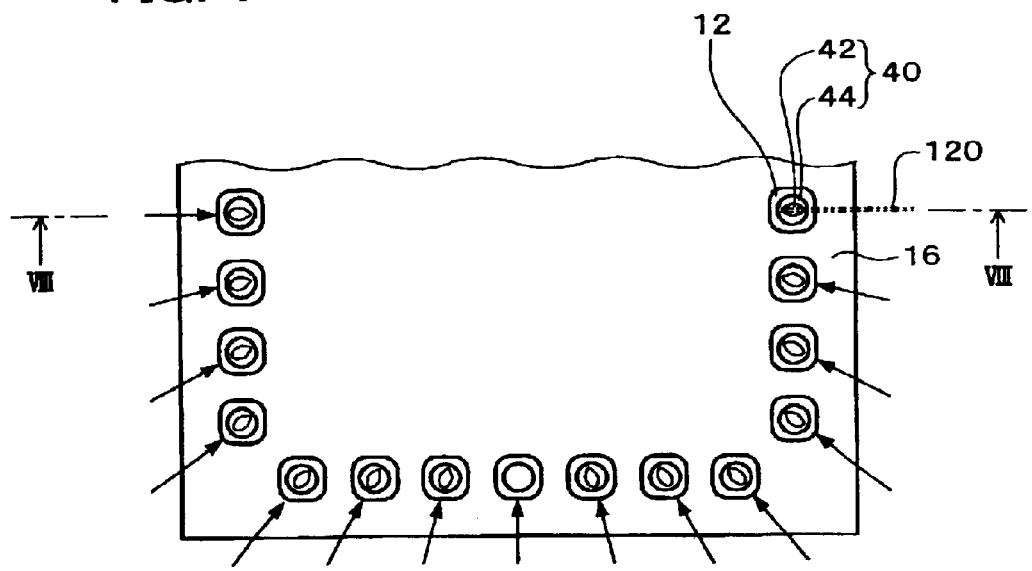
FIG. 7 further illustrates the semiconductor element having bumps and the method of manufacturing the same according to the first embodiment of the present invention.
Figure 8:
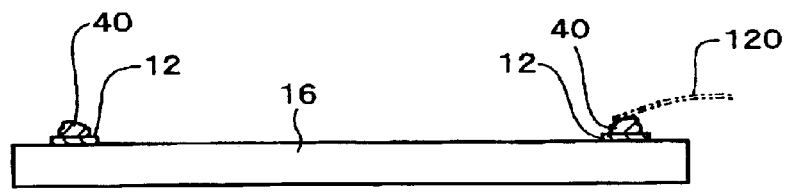
FIG. 8 is a cross-sectional view along the line VIII—VIII shown in FIG. 7.

This enables another wire 120 to be easily bonded to the top end 42 of the bump 40 in a subsequent step (see FIGS. 7 and 8). In more detail, a junction region between the wire 120 and the bump 40 can be secured sufficiently by drawing the wire 120 in the direction in which the width of the bump 40 is elongated. Therefore, the wire 120 can be bonded to the bump 40 in a reliable and stable state.

In the step of moving the tool 30 in the width direction of the tip 22 (direction indicated by the arrow shown in FIGS. 3 and 4), the height of the top end 42 of the bump 40 may be decreased along the moving direction of the tool 30. In other words, the bump 40 may be sloped so that the height of the bump 40 decreases along the moving direction of the tool 30.

This enables another wire 120 to be easily bonded to the top end 42 of the bump 40 in a subsequent step (see FIGS. 7 and 8). In more detail, the distance between the wire 120 and the semiconductor element 10 can be increased by drawing the wire 120 toward the bump 40 so as to descend from the higher side of the bump 40. Therefore, the wire 120 can be prevented from coming in contact with the semiconductor element 10. Moreover, since the wire 120 can be easily prevented from coming in contact with the semiconductor element 10, limitations to design such as the loop shape and loop height of the wire 120 and the distance between the electrode 12 and the corner (edge) of the semiconductor chip 16 are eliminated, whereby the degree of freedom relating to the design (decrease in height and length of loop of the wire, for example) can be increased.

FIGS. 7 and 8 illustrate the moving direction of the tool 30 (direction of the width of the tip 22). In more detail, FIG. 7 is a plan view of the semiconductor chip after formation of the bump. FIG. 8 is a cross-sectional view along the line VIII—VIII shown in FIG. 7. Each direction indicated by an arrow shown in FIG. 7 indicates a drawing direction of the wire 120 to be connected in a subsequent step toward the bump 40. The wire 120 electrically connects the electrode 12 of the semiconductor chip 16 with another electronic component (interconnect of a substrate or another semiconductor chip, for example).

As shown in FIG. 7, the tool 30 may be moved in the drawing direction of the wire 120 to be connected with the bump 40 toward the bump 40. The drawing direction of the wire 120 is not limited to the direction indicated by the arrow shown in FIG. 7. The direction may be arbitrarily determined depending on the position of the bump 40 (or electrode 12).

In the case where two or more electrodes 12 are formed on the edge portion (edge portions of four sides of the external shape in FIG. 7) of the semiconductor chip 16, the tool 30 may be moved in the direction from the edge portion of the semiconductor chip 16 toward the center portion of the semiconductor chip 16. In the case where two or more electrodes 12 are formed on the edge portion of the semiconductor chip 16 as shown in FIG. 7, the wire 120 is generally drawn from the edge portion of the semiconductor chip 16 toward the center portion of the semiconductor chip 16. For example, two or more of a plurality of the wires 120 are drawn toward the bumps 40 so as to extend in directions which converge at one point (not shown) at the center portion of the semiconductor chip 16.

This enables the width (length) of the top end 42 of the bump 40 to be elongated in the drawing direction of the wire 120, as shown in FIGS. 7 and 8. Moreover, the top end 42 of the bump 40 can be formed so that the height (thickness) of the top end 42 decreases along the drawing direction of the wire 120, as shown in FIG. 8. Specifically, the height of the bump 40 on the side close to the edge of the semiconductor chip 16 can be made greater than that on the side close to the center portion of the semiconductor chip 16. The effects of these features are the same as described above.

Figure 5:
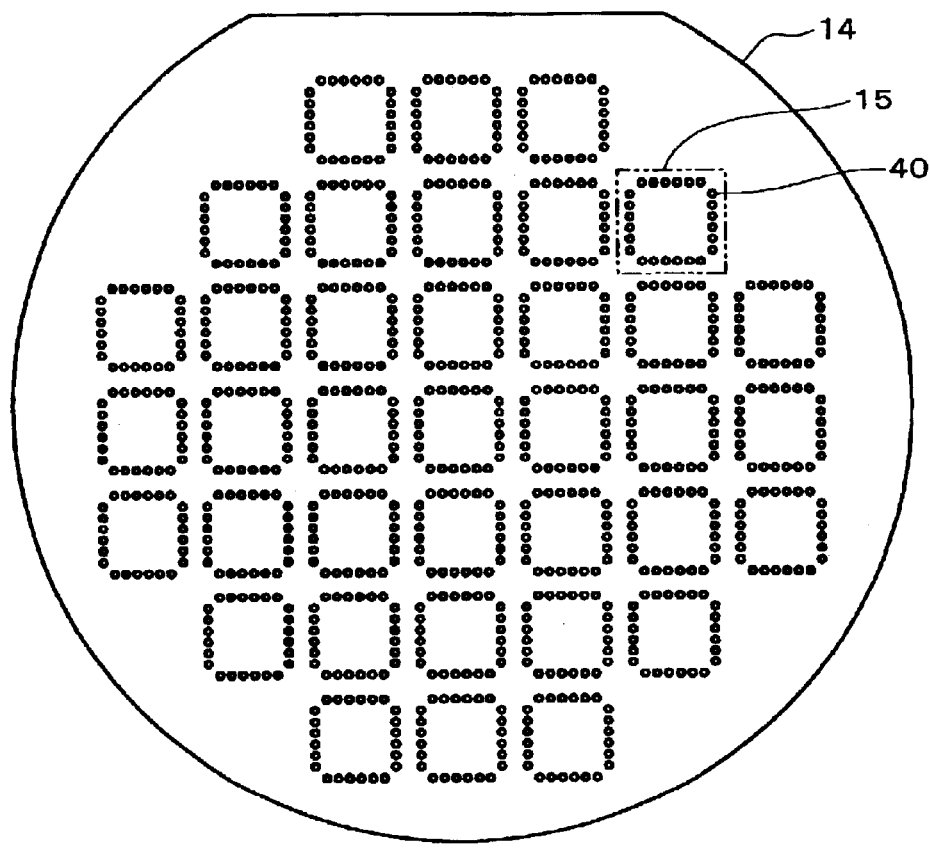
FIG. 5 illustrates the semiconductor element having bumps and the method of manufacturing the same according to the first embodiment of the present invention.
Figure 6:
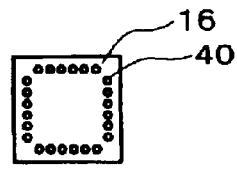
FIG. 6 further illustrates the semiconductor element having bumps and the method of manufacturing the same according to the first embodiment of the present invention.

The above description of the moving direction of the tool 30 may be applied not only to the semiconductor chip 16, but also to the semiconductor wafer 14. In more detail, the above description of the moving direction of the tool 30 may be applied to the case where the semiconductor chip 16 is replaced with the region 15 of the semiconductor wafer 14 including one of the integrated circuits, as shown in FIGS. 5 and 6.

Figure 2B:
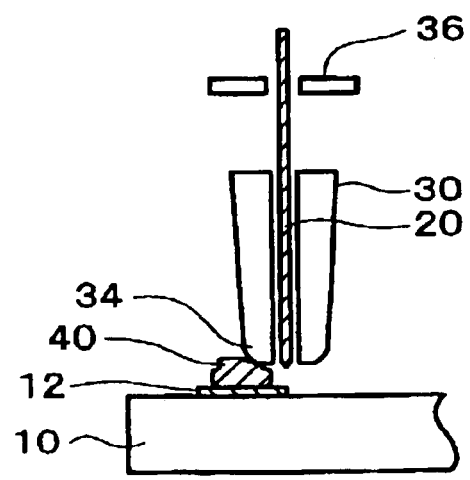

In the example shown in FIGS. 2A and 2B, the wire 20 is thinly stretched and cut by moving the tool 30 in the width direction of the tip 22. In this case, the tool 30 allows a part of the wire 20 inserted into the hole 32 in the tool 30 to be moved in the direction so as to be apart from the tip 22 (direction indicated by the arrow shown in FIG. 2A). This enables the top end 42 of the bump 40 to be formed in an optimum shape and the wire 20 to be cut at the same time. Moreover, the wire 20 can be cut at a specific position by moving the tool 30 in the width direction of the tip 22 while applying ultrasonic vibration. Specifically, in the case of forming a plurality of bumps, the wire 20 can be cut at a uniform position each time the bump is formed. Therefore, the length of a part of the wire 20 which projects outside the tool 30 can be made uniform, whereby the diameter of the ball-shaped tip 22 can be the same. Therefore, the continuous processing capability of the wire 20 is stabilized.

In the case where the semiconductor element 10 has a plurality of electrodes 12, the bump 40 is formed on each electrode 12 by repeating each of the above-described steps (steps shown in FIGS. 1A to 2B). Specifically, the tip of the wire 20 which projects outside the tool 30 shown in FIG. 2B is formed in the shape of a ball as shown in FIG. 1A, and bonded to another electrode of the semiconductor element 10.

The above example illustrates a case where the bump is formed on the electrode 12 of the semiconductor element 10. However, the form of the electrode is not limited in the method for forming a bump of the present embodiment. For example, the bump may be formed on a part of a lead (an interconnect of a substrate or an inner lead of a lead frame).

According to the method of manufacturing a semiconductor element having bumps of the present embodiment, the bump 40 having an almost smooth surface can be easily formed on the electrode 12. Moreover, since the bump 40 is formed on the electrode 12 and the surface of the bump 40 is smoothed by using the tool 30 at the time of bonding, the manufacturing steps are easy and quick. This eliminates the need to separately perform a step of smoothing the surface of the bump 40 (smoothing step, for example), for example.

Moreover, since the bump 40 can be formed in a shape optimum for wire bonding performed in a subsequent step, the position of the wire 120 on the bump 40 can be prevented from deviating or the wire 120 can be prevented from being bonded in a crooked state.

Any of the subjects (configuration, action, and effect) derived from the features described relating to the above manufacturing method may be selectively applied to the method for forming a bump according to the present embodiment.

FIGS. 3 to 8 illustrate a semiconductor element having bumps according to the present embodiment. This semiconductor element having bumps may be manufactured by using the above-described method. In the following description, subjects derived from the features of the above method are omitted.

The semiconductor element 10 may be either the semiconductor wafer 14 as shown in FIG. 5 or the semiconductor chip 16 as shown in FIG. 6.

The semiconductor element 10 includes the bump 40 provided on the electrode 12. The bump 40 has the bottom end 44 connected with the electrode 12, and the top end 42 having an almost smooth surface (surface on which the projection is deformed).

As shown in FIG. 3, the width of the top end 42 of the bump 40 is elongated in a specific direction in a plan view of the semiconductor element 10. In more detail, the width of the top end 42 of the bump 40 is elongated in the drawing direction of the wire 120 toward the bump 40, as shown in FIG. 7. In other words, the width of the top end 42 is elongated in the direction from the edge portion of the semiconductor chip 16 (or the region 15 of the semiconductor wafer 14 (see FIG. 5)) to the center portion of the semiconductor chip 16.

As shown in FIG. 4, the top end 42 of the bump 40 is sloped in a specific direction. A part of the top end 42 may be sloped as shown in FIG. 4, or the entire top end 42 may be sloped. At least a part of the top end 42 is an almost smooth surface. As shown in FIG. 8, the top end 42 is sloped so that the height of the top end 42 decreases along the drawing direction of the wire 120 toward the bump 40. In other words, the top end 42 is sloped so that the height of the top end 42 decreases along the direction from the edge portion of the semiconductor chip 16 (or the region 15 of the semiconductor wafer 14 (see FIG. 5)) to the center portion of the semiconductor chip 16.

According to the semiconductor element having bumps of the present embodiment, the wire (wire 120, for example) can be easily bonded to the top end 42 of the bump 40.

Second Embodiment

FIGS. 9 to 14 are views showing a semiconductor device and a method of manufacturing the same according to the present embodiment. In the present embodiment, second bonding of the wire 120 to the bump 40 is performed.

In the example given below, a semiconductor device is manufactured by using the semiconductor chip having bumps described in the above embodiment (including a semiconductor chip manufactured by using the above method). The semiconductor chip 16 may be formed by dividing the semiconductor wafer 14 having bumps into a plurality of individual pieces.

The features of the present embodiment may be applied to a semiconductor chip differing from the above embodiment (common semiconductor chip, for example).

Figure 9:
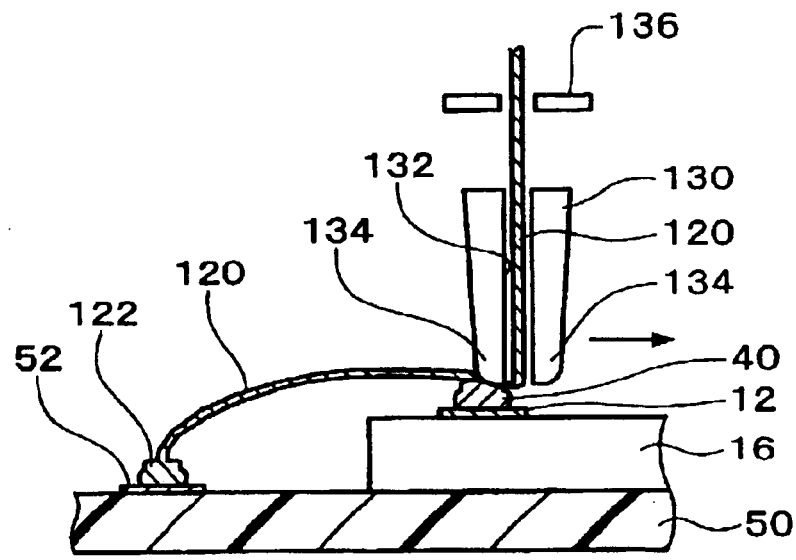
FIG. 9 illustrates a method of manufacturing a semiconductor device according to a second embodiment of the present invention.
Figure 10:
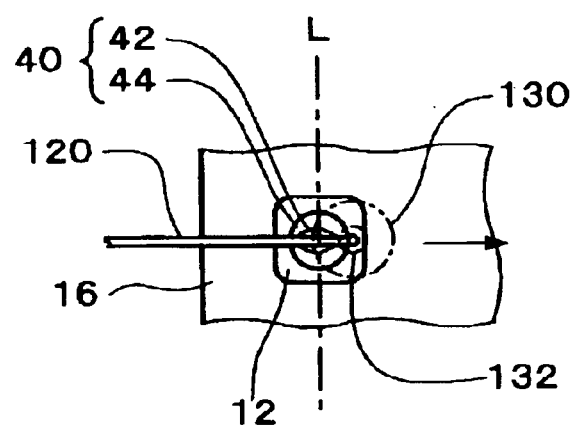
FIG. 10 further illustrates the method of manufacturing a semiconductor device according to the second embodiment of the present invention.
Figure 11:
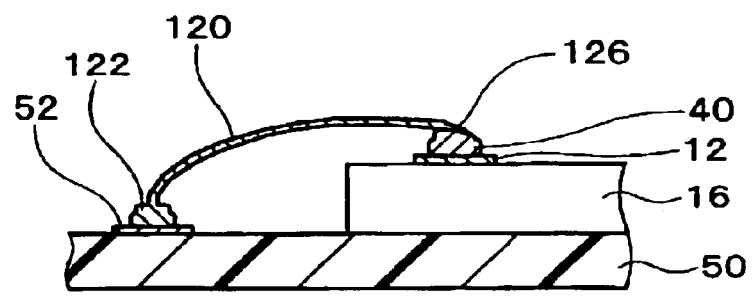
FIG. 11 further illustrates a semiconductor device and a method of manufacturing the same according to the second embodiment of the present invention.
Figure 12:
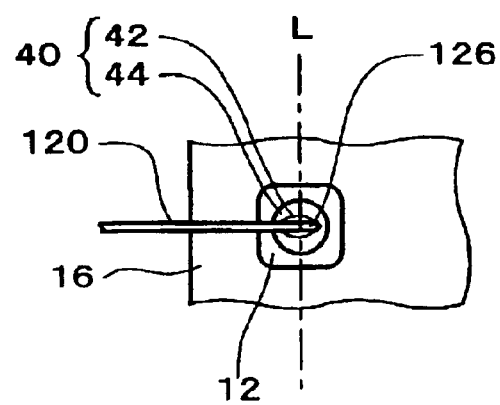
FIG. 12 further illustrates the semiconductor device and the method of manufacturing the same according to the second embodiment of the present invention.

FIGS. 9 to 12 illustrate a second bonding step of the wire. FIG. 10 is a partial plan view of a semiconductor chip shown in FIG. 9. FIG. 12 is a partial plan view of the semiconductor chip shown in FIG. 11. In FIG. 10, a tool is indicated by a two-dotted line.

As shown in FIG. 9, an electrode 52 is disposed outside the semiconductor chip 16. In the example shown in FIG. 9, the electrode 52 is a part of a lead (or interconnect) supported on a substrate 50. The electrode 52 may be a land. The semiconductor chip 16 is mounted on the substrate 50 so that the electrode 52 is disposed outside the semiconductor chip 16.

The substrate 50 may be formed of either an organic material (flexible substrate formed of a polyimide resin or the like) or an inorganic material (ceramic substrate or glass substrate). The substrate 50 may be formed of a composite structure (glass epoxy substrate) of these materials. The substrate 50 may be a single layer substrate or a multilayer substrate.

As a modification, the electrode 52 may be a part of a lead (inner lead, for example) supported on a lead frame of a plate material. In this case, the lead is not supported by a member and has a free end. The lead is made up of an inner lead and an outer lead. The lead is disposed so that the inner lead faces the electrode 12 of the semiconductor chip 16. The semiconductor chip 16 is mounted on a die pad (or heat sink) (not shown) so that the electrode 52 is disposed outside the semiconductor chip 16.

As shown in FIG. 9, a tool 130 which supports the wire 120 is provided. A tip 122 of the wire 120 is formed in the shape of a ball and bonded to the electrode 52 by using the tool 130. The wire 120, the tool 130, and the damper 136 may be the same as described above. The tool 130 has a hole 132 and an open end 134. The method of forming the tip 122 of the wire 120 in the shape of a ball is the same as described above.

As shown in FIG. 9, after the tip 122 is bonded to the electrode 52, the wire 120 is drawn to the bump 40 on the electrode 12. In more detail, the wire 120 is drawn beyond a center line L of the bump 40, as shown in FIG. 10. As shown in FIG. 10, the center line L is a virtual line which passes through the center of the width of the bump 40 in the drawing direction of the wire 120, and intersects the drawing direction of the wire 120 at right angles.

A part of the wire 120 is bonded to the bump 40. In this case, the wire 120 is bonded to the bump 40 by using a part of the tool 130 (open end 134) on the side of the first electrode in the drawing direction of the wire 120. As shown in FIGS. 9 and 10, a part of the wire 120 may be bonded to the center (part which overlaps the center line L shown in FIG. 10) of the bump 40 in the drawing direction of the wire 120, or bonded to a part beyond the center (part on the right side of the center line L shown in FIG. 10). In the example shown in FIGS. 9 and 10, a region including the center of the bump 40 in the drawing direction of the wire 120 is pressed by the open end 134. As shown in FIGS. 9 and 10, the wire 120 may be bonded to the bump 40 in a part of the area in which the bump 40 overlaps the wire 120, or the wire 120 may be bonded to the bump 40 in the entire area in which the bump 40 overlaps the wire 120. In the former case, it is preferable not to press at least a part of the wire 120 which is not beyond the center of the bump 40 in the drawing direction of the wire 120 (part on the left side of the center line L shown in FIG. 10). This enables the wire 120 to be supported (drawn) by an area which remains undeformed without being pressed. Specifically, the wire 120 can be prevented from coming in contact with the semiconductor chip 16.

It is preferable to perform the bonding step of the wire 120 to the bump 40 while applying ultrasonic vibration. Ultrasonic vibration is applied to the bump 40 through the tool 130. This enables the wire 120 to be joined to the bump 40 in a good state.

In the example shown in FIG. 9, the tool 30 is moved on the bump 40 in a width direction of the bump 40 while applying pressure so that a part of the wire 120 is deformed. In other words, the tool 30 is slid in the direction parallel to the surface of the semiconductor chip 16 while applying pressure to the bump 40. In this case, the tool 30 may be moved in the drawing direction of the wire 120 toward the bump 40 (direction indicated by an arrow shown in FIG. 9 or 10).

The width (length) of the bump 40 (top end 42, in particular) is elongated in the drawing direction of the wire 120. This enables another wire 220 to be easily bonded to the bump 40 in a subsequent step (see FIG. 15A). In more detail, a junction region between the wire 220 and the bump 40 can be secured sufficiently, whereby the wire 220 can be bonded to the bump 40 in a reliable and stable state. Moreover, since the width of the bump 40 is elongated in the drawing direction of the wire 120, short-circuiting of the adjacent bumps 40 can be prevented. Furthermore, since the width of the bump 40 can be elongated in the moving direction of the tool 130, the width of the bump 40 can be elongated in an arbitrary direction other than the direction in which the bump 40 is spread by ultrasonic vibration.

The height (thickness) of the top end 42 of the bump 40 may be decreased along the drawing direction of the wire 120 toward the bump 40 by moving the tool 130.

Figure 15A:
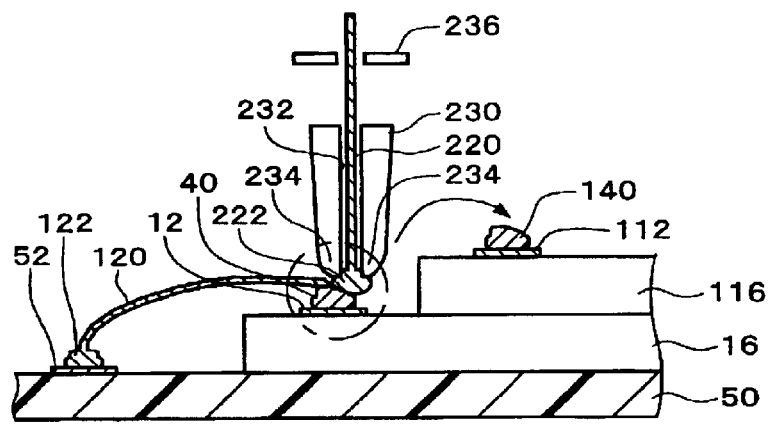
FIGS. 15A and 15B illustrate a semiconductor device and a method of manufacturing the same according to a third embodiment of the present invention.

This enables another wire 220 to be easily bonded to the bump 40 in a subsequent step (see FIG. 15A). In more detail, a tip 222 of the wire 220 formed in the shape of a ball can be easily bonded at a position shifted from the center of the bump 40.

In the example shown in FIGS. 9 and 11, the wire 20 is thinly stretched and cut by moving the tool 130 in a width direction of the tip 122. In this case, the tool 130 is moved so that a part of the wire 120 inserted into the hole 132 in the tool 130 is moved in the direction so as to be apart from the bump 40 (direction indicated by the arrow shown in FIG. 9). This enables the bump 40 to be formed in an optimum shape and the wire 120 to be cut at the same time. The wire 120 can be cut at a specific position by moving the tool 130 in the width direction of the bump 40 while applying ultrasonic vibration. Specifically, the wire 120 can be cut at a uniform position each time the wire 120 is bonded to each of a plurality of bumps 40. Therefore, the length of a part of the wire 120 which projects outside the tool 130 can be made uniform, whereby the diameter of the ball-shaped tip 122 can be the same. Therefore, the continuous processing capability of the wire 120 is stabilized.

A joint section 126 of the wire 120 is formed on the bump 40 in this manner, as shown in FIGS. 11 and 12. As shown in FIG. 11, the joint section 126 of the wire 120 is deformed so that the diameter of the joint section 126 is smaller than the diameter of the wire 120 before bonding. In the case where the semiconductor chip 16 has a plurality of bumps 40, a plurality of wires 120 are formed by repeating each of the above-described steps.

The above example illustrates a case where the electrode 52 (part of the lead) of the substrate 50 is electrically connected with the electrode 12 of the semiconductor chip 16 through the wire 120. However, the method of manufacturing a semiconductor device of the present embodiment is not limited to the above example. For example, the method may be applied to the case where the electrodes of a plurality of semiconductor chips are electrically connected through the wire 120.

According to the method of manufacturing a semiconductor device of the present embodiment, apart of the wire 120 is bonded to the center of the bump 40 or a part of the bump 40 beyond the center in the drawing direction of the wire 120. This enables a part of the wire 120 which projects from the bump 40 toward the electrode 52 in the drawing direction of the wire 120 to be prevented from being pressed by the tool 130, for example. This prevents the wire 120 from sagging. Therefore, the wire 120 can be bonded to the bump 40 in a reliable and stable state.

Moreover, since the width of the bump 40 is elongated in the drawing direction of the wire 120 and the height of the bump 40 decreases along the drawing direction of the wire 120, the wire 120 can be bonded in a more reliable and stable state.

Figure 13A:
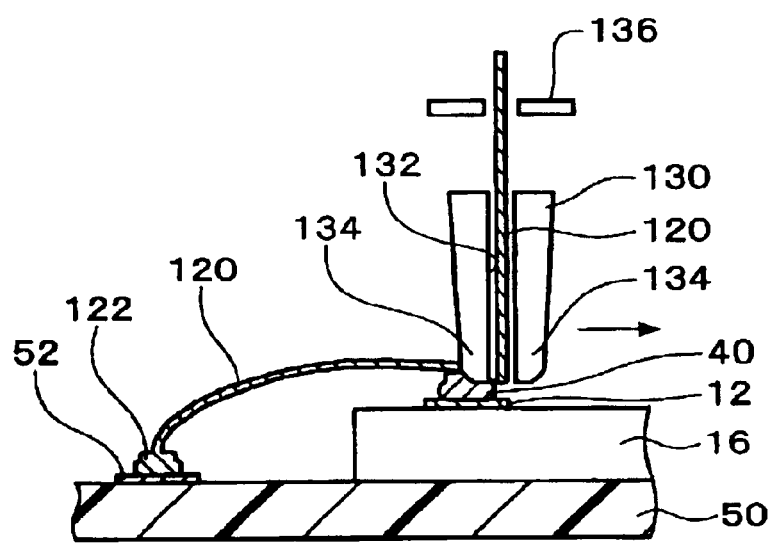
FIGS. 13A and 13B illustrates a semiconductor device and a method of manufacturing the same according to a modification of the second embodiment of the present invention.
Figure 13B:
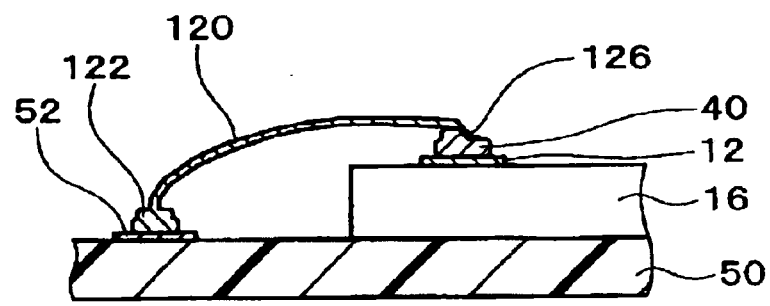

A modification of the present embodiment is described below. In this modification, a part of the bump 40 is deformed in the step of bonding a part of the wire 120 to the bump 40, as shown in FIGS. 13A and 13B. Specifically, a part of the bump 40 is plastically deformed by pressing the open end 134 of the tool 130 against the bump 40, as shown in FIG. 13A. In a plan view of the bump 40, a region of the bump 40 to be deformed overlaps a region in which the open end 134 comes in contact with the bump 40. The region of the bump 40 to be deformed may be the same as the bonding region of the wire 120 to the bump 40.

The tool 130 may be moved on the bump 40 in the width direction of the bump 40 (direction indicated by an arrow shown in FIG. 13A) while applying pressure so that a part of the bump 40 is deformed. The form of movement of the tool 130 and its effects are the same as described above.

As shown in FIG. 13B, a part of the bump 40 can be deformed in the joint section 126 between the wire 120 and the bump 40.

According to this modification, the wire 120 can be drawn up in the direction opposite to the semiconductor chip 16 (above the semiconductor chip 16) by using the undeformed portion of the bump 40 as a fulcrum. Specifically, the wire 120 can be prevented from coming in contact with the semiconductor chip 16.

Any of the subjects (configuration, action, and effect) derived from the features described relating to the above manufacturing method may be selectively applied to this modification.

Figure 14:
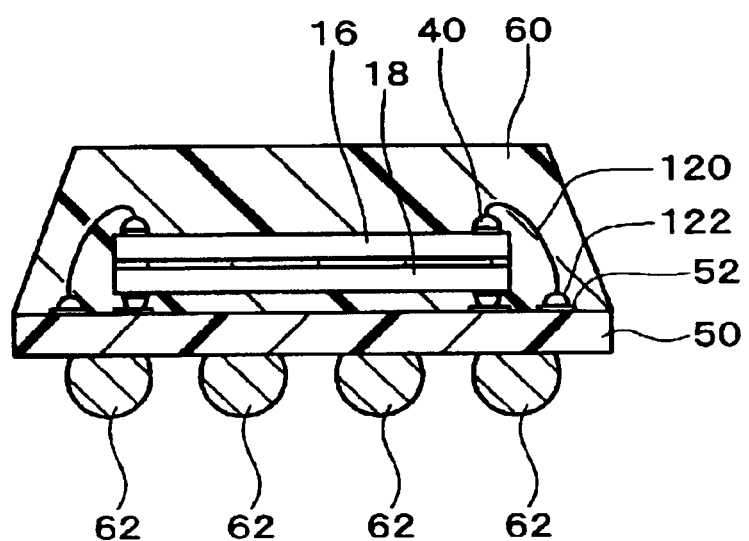
FIG. 14 further illustrates the semiconductor device according to the second embodiment of the present invention.

FIG. 14 shows an example of a semiconductor device to which the present embodiment is applied. In the example shown in FIG. 14, a semiconductor device includes a plurality of semiconductor chips 16 and 18, the substrate 50 having the electrodes 52, a sealing section 60, and external terminals 62. The semiconductor device according to the present embodiment is not limited to the following example.

Interconnects are formed on the substrate 50. A part of the interconnects is the electrodes 52. A plurality of semiconductor chips 16 and 18 are stacked on the substrate 50. In more detail, the semiconductor chip 18 is bonded face down to the substrate 50, and the semiconductor chip 16 is disposed on the semiconductor chip 18. The semiconductor chip 16 is disposed so that the side of the semiconductor chip 16 having the electrodes 12 faces opposite to the semiconductor chip 18. Therefore, the semiconductor chip 16 can be electrically connected with the substrate 50 through the wires 120. In more detail, the bumps 40 are provided on the semiconductor chip 16, and electrically connected with the electrodes 52 of the substrate 50 through the wires 120. The connection structure through the wires 120 is the same as described above.

The sealing section 60 is generally formed of a resin (epoxy resin, for example). A plurality of external terminals (solder balls, for example) 62 are provided on the substrate 50. The external terminals 62 are electrically connected with the interconnects of the substrate 50. The external terminals 62 are provided on the side of the substrate 50 opposite to the side on which a plurality of semiconductor chips 16 and 18 are mounted through through holes (not shown) formed in the substrate 50, for example.

According to the semiconductor device of the present embodiment, a device capable of achieving a decrease in loop height of the wire 120 and ensuring highly reliable electrical connection can be provided.

Any of the subjects (configuration, action, and effect) derived from the features described relating to the above manufacturing method may be selectively applied to the semiconductor device according to the present embodiment. For example, the present embodiment maybe applied to the case where the substrate 50 is replaced with another semiconductor chip.

Third Embodiment

FIGS. 15A to 20 are views showing a semiconductor device and a method of manufacturing the same according to the present embodiment. In the present embodiment, first bonding of another wire 220 to the bump 40 to which the wire 120 is bonded is performed.

The following example includes the manufacturing method described in the above embodiment. The features of the present embodiment may be applied after performing a step different from the above embodiment (common wire bonding step, for example).

Figure 15B:
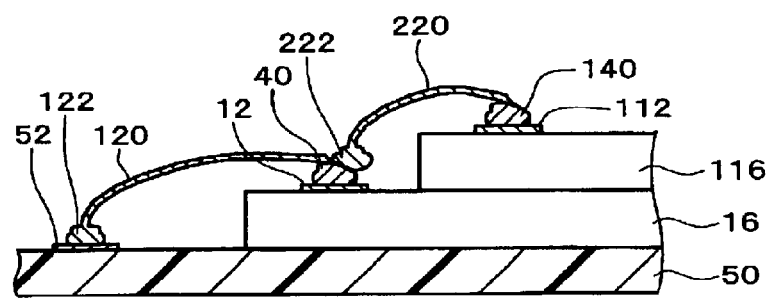
Figure 16:
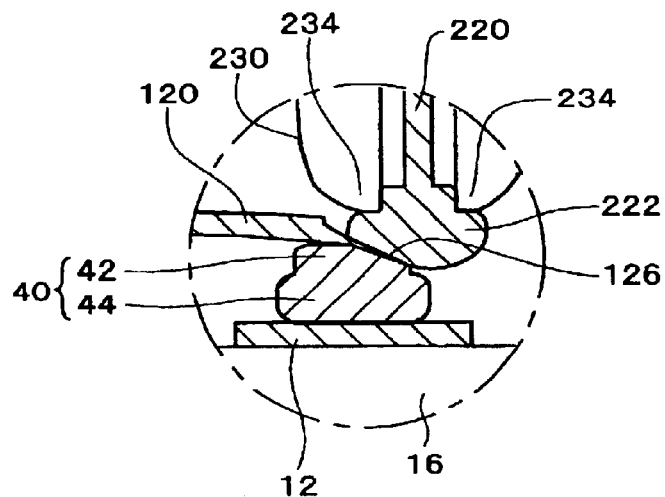
FIG. 16 is a partially enlarged view of FIG. 15A.
Figure 17:
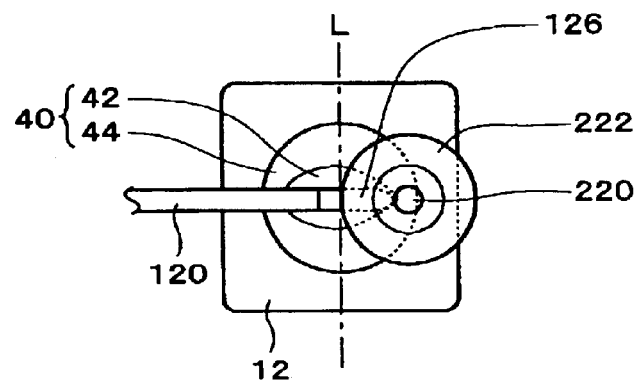
FIG. 17 further illustrates the semiconductor device and the method of manufacturing a semiconductor device according to the third embodiment of the present invention.
Figure 18:
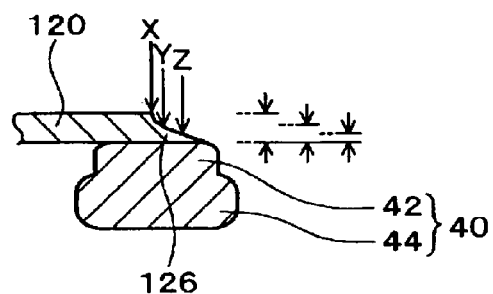
FIG. 18 further illustrates the semiconductor device and the method of manufacturing a semiconductor device according to the third embodiment of the present invention.

FIGS. 15A and 15B are views showing a bonding step of the wire. FIG. 16 is a partially enlarged view of FIG. 15A. FIG. 17 is a plan view of a connection structure shown in FIG. 16. In FIG. 17, illustration of the tool is omitted. FIG. 18 illustrates a contact area with the wire.

As shown in FIG. 15A, another electrode 112 is provided in addition to the form shown in FIG. 11 described in the above embodiment. In the example shown in FIG. 15A, a plurality of semiconductor chips 16 and 116 are stacked on the substrate 50 so that the electrodes 52, 12, and 112 are exposed. The semiconductor chip 116 is mounted on the semiconductor chip 16. In this case, the external shape of the semiconductor chip 116 on the top is generally smaller than the external shape of the semiconductor chip 16 on the bottom.

As shown in FIG. 15A, a tool 230 which supports the wire 220 is provided. The tip 222 of the wire 220 is formed in the shape of a ball. The wire 220, the tool 230, and a clamper 236 may be the same as described above. The tool 230 has a hole 232 and an open end 234. The method of forming the tip 222 of the wire 220 in the shape of a ball is also the same as described above.

The tip 222 of the wire 220 is bonded to the bump 40 by using the open end 234 of the tool 230. In this case, the tip 222 is bonded to the bump 40 in a state in which at least a part of the tip 222 overlaps the wire 120, as shown in FIGS. 16 and 17. This enables the planar area of the bump 40 to be effectively utilized. It is preferable to bond the tip 222 to the bump 40 while applying ultrasonic vibration.

As shown in FIG. 16, the above bonding step is performed so that the undeformed portion of the wire 120 connected with the bump 40 is not deformed by the tip 222 of the wire 220 and the tool 230. In this case, it is preferable to prevent the tip 222 of the wire 220 and the tool 230 from coming in contact with the undeformed portion of the wire 120. The undeformed portion of the wire 120 refers to a part which is not deformed in the step of bonding the wire 120 to the bump 40. Specifically, a deformed portion of the wire 120 refers to the joint section 126 of the wire 120.

In the example shown in FIG. 18, the above bonding step is performed so that the tip 222 of the wire 220 and the tool 230 do not come in contact with a part of the wire 120 which is less deformed than a point X (on the left side of the point X). The point X shown in FIG. 18 is a boundary point of the region of the wire 120 deformed when bonding the wire 120 to the bump 40.

This prevents the shape of loop of the wire 120 connected with the bump 40 from being changed. In more detail, the wire 120 can be prevented from coming in contact with the semiconductor chip 16 due to a decrease in loop height of the wire 120, from collapsing sideways, or from being damaged.

The tip 222 of the wire 220 and the tool 230 may be prevented from coming in contact with a part of the wire 120 which is less deformed than a point Y shown in FIG. 18 (on the left side of the point Y). The point Y shown in FIG. 18 is a boundary point at which the diameter (thickness) of the wire 120 is almost halved. This enables the above effects to be achieved more reliably.

The tip 222 of the wire 220 and the tool 230 may be prevented from coming in contact with a part of the wire 120 which is less deformed than a point Z shown in FIG. 18 (on the left side of the point Z). The point Z shown in FIG. 18 is a boundary point at which the diameter (thickness) of the wire 120 decreases to almost one third the original diameter. This enables the above effects to be achieved still more reliably.

As shown in FIG. 17, the bonding step may be performed in a state in which the center of the tip 222 of the wire 220 (part of the wire 220 continuous from the tip 222 to the hole 232 in FIG. 17) is disposed on a part of the bump 40 beyond the center in the drawing direction of the wire 120 (on the right side of the center line L shown in FIG. 17). Specifically, the center of the tip 222 may be shifted in the drawing direction of the wire 120 toward the bump 40. In this case, if the width of the bump 40 (top end 42, in particular) is elongated in the drawing of the wire 120, a junction region between the wire 120 and the bump 40 can be secured sufficiently. The form of increasing the width of the bump 40 is the same as described in the first and second embodiments. Moreover, if the height of the bump 40 decreases along the drawing direction of the wire 120, the tip 222 of the wire 220 can be easily placed on the bump 40. The form of sloping the bump 40 is the same as described in the first and second embodiments. These features enable the tip 222 of the wire 220 to be bonded to the bump 40 in a reliable and stable state.

As shown in FIG. 17, the entire tip 222 may be disposed on a part of the bump 40 beyond the center of the bump 40 in the drawing direction of the wire 120 (part on the right side of the center line L in FIG. 17), or disposed to include the center of the bump 40 in the drawing direction of the wire 120 (part which overlaps the center line L in FIG. 17). The tip 222 of the wire 220 may be bonded to the bump 40 in a state in which a part of the tip 222 overlaps a part of the bump 40 as shown in FIG. 17, or the entire tip 222 overlaps a part of the bump 40.

As shown in FIG. 15B, the wire 220 is electrically connected with the electrode 112 after the above bonding step. In more detail, a bump 140 is formed on the electrode 112 in advance. The wire 220 is drawn toward the bump 140, and a part of the wire 220 is bonded to the bump 140. If the bump 140 is the same as the bump 40, the effects described in the second embodiment can be achieved in the bonding step of the wire 220 to the bump 140.

According to the method of manufacturing a semiconductor device of the present embodiment, since the bonding step is performed so that the undeformed portion of the wire 120 is not deformed by the tip 222 of the wire 220 and the tool 230, another wire 220 can be bonded to the bump 40 without causing connection failure between the wire 120 and the bump 40.

Any of the subjects (configuration, action, and effect) derived from the features described relating to the above manufacturing method may be selectively applied to the method of manufacturing a semiconductor device according to the present embodiment.

Figure 19:
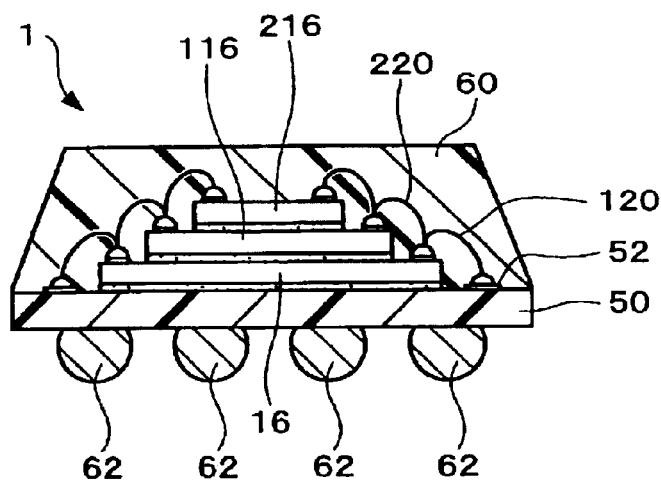
FIG. 19 further illustrates the semiconductor device according to the third embodiment of the present invention.

FIG. 19 shows an example of a semiconductor device to which the present embodiment is applied. In the example shown in FIG. 19, the semiconductor device includes a plurality of semiconductor chips 16, 116, and 216, the substrate 50 having the electrodes 52, the sealing section 60, and the external terminals 62. The substrate 50, the sealing section 60, and the external terminals 62 are the same as described above. The semiconductor device according to the present embodiment is not limited to the following example.

A plurality of semiconductor chips 16, 116, and 216 are stacked on the substrate 50. In more detail, the semiconductor chip 16 is bonded face down to the substrate 50. The semiconductor chip 116 is disposed on the semiconductor chip 16. The semiconductor chip 216 is disposed on the semiconductor chip 116. Each of the semiconductor chips 16, 116, and 216 is disposed so that the side having the electrodes faces opposite to the substrate 50. Therefore, the semiconductor chips 16, 116, and 216 can be electrically connected with the substrate 50 through the wires 120 and 220. The connection structure through the wires 120 and 220 is the same as described above.

According to the semiconductor device of the present embodiment, a device capable of achieving a decrease in loop height of the wires 120 and 220 and ensuring highly reliable electrical connection can be provided.

Figure 20:
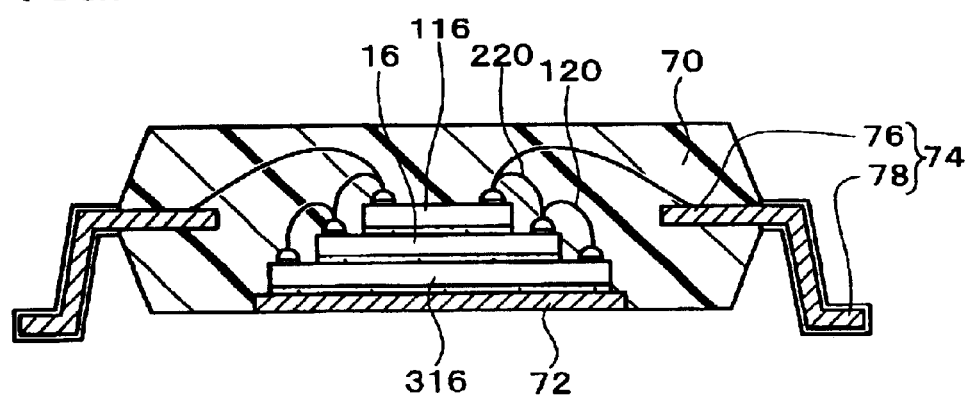
FIG. 20 further illustrates the semiconductor device according to the third embodiment of the present invention.

FIG. 20 shows another example of a semiconductor device to which the present embodiment is applied. In the example shown in FIG. 20, a semiconductor device includes a plurality of semiconductor chips 16, 116, and 316, a sealing section 70, a die pad 72 on which the semiconductor chips are mounted, and leads 74. This semiconductor device has a Quad Flat Package (QFP) type package structure.

A plurality of semiconductor chips 16, 116, and 316 are placed on one side of the die pad 72. The other side of the die pad 72 is exposed from the sealing section 70. This enables radiation properties of the semiconductor device to be improved. The sealing section 70 is generally formed of an epoxy resin. Each of the leads 74 includes an inner lead 76 electrically connected with one of the semiconductor chips (semiconductor chip 116 in FIG. 20) inside the sealing section 70, and an outer lead 78 which projects outside the sealing section 70. The outer lead 78 is bent in a specific shape (gull-wing shape in FIG. 20), and becomes an external terminal of the semiconductor device. As shown in FIG. 20, a metal film (plated film, for example) such as a brazing material is provided to the outer leads 78. The semiconductor chips 16, 116, and 316 are electrically connected with one another through the wires 120 and 220. The connection structure through the wires is the same as described above.

According to the semiconductor device of the present embodiment, a device capable of achieving a decrease in loop height of the wires 120 and 220 and ensuring highly reliable electrical connection can be provided.

Figure 21:
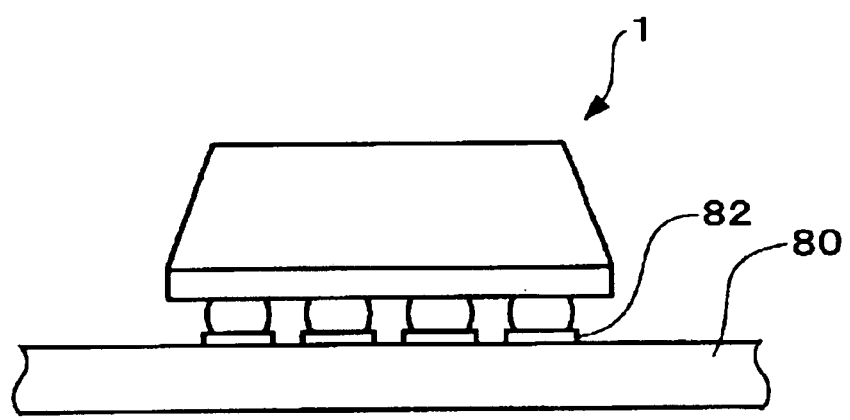
FIG. 21 shows a circuit board according to an embodiment of the present invention.

FIG. 21 shows a circuit board to which the above embodiment is applied. The semiconductor device 1 shown in FIG. 19 is mounted on a circuit board 80. As the circuit board 80, an organic substrate such as a glass epoxy substrate is generally used. An interconnection pattern 82 is formed of copper or the like on the circuit board 80 so that a desired circuit is formed. The interconnection pattern 82 is joined to the external terminals of the semiconductor device.

Figure 22:
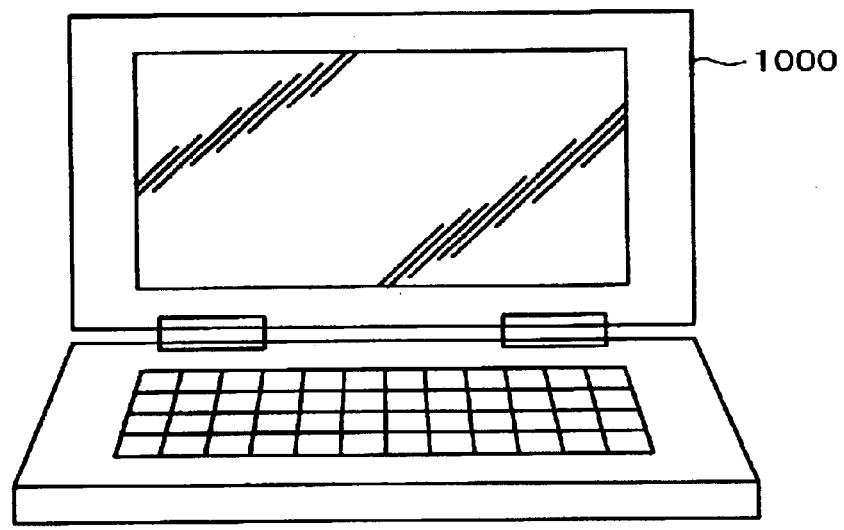
FIG. 22 shows electronic equipment according to an embodiment of the present invention.
Figure 23:
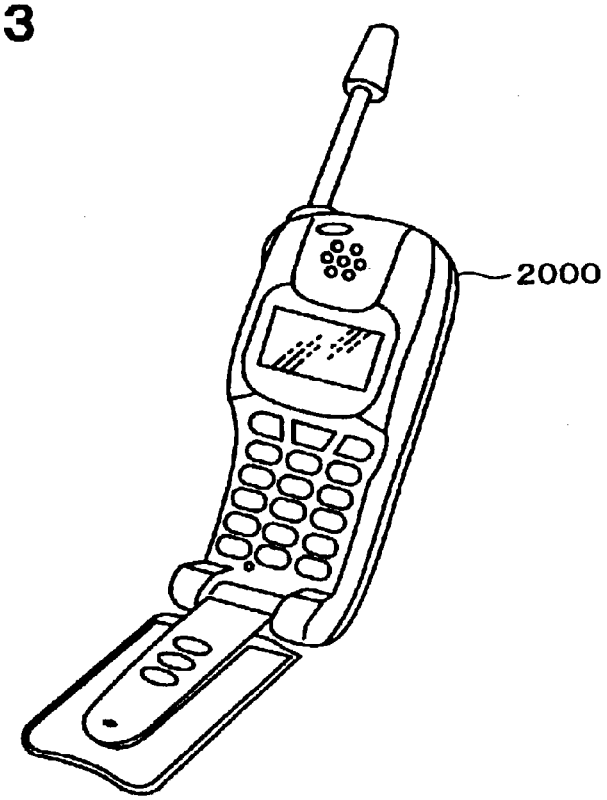
FIG. 23 further shows electronic equipment according to an embodiment of the present invention.

FIGS. 22 and 23 respectively show a notebook-type personal computer 1000 and a portable telephone 2000 as examples of electronic equipment including the semiconductor device according to the embodiment of the present invention.

The present invention is not limited to the above-described embodiments. Various modifications and variations are possible. For example, the present invention includes configurations essentially the same as the configurations described in the embodiments (for example, configurations having the same function, method, and results, or configurations having the same object and results). The present invention includes configurations in which any unessential part of the configuration described in the embodiments is replaced. The present invention includes configurations having the same effects or achieving the same object as the configurations described in the embodiments. The present invention includes configurations in which conventional technology is added to the configurations described in the embodiments.

What is claimed is:

1. A method of manufacturing a semiconductor device, comprising:

bonding a tip of a wire to a first electrode by using a tool;

drawing the wire from the first electrode to a bump on a second electrode;

bonding a part of the wire to a center of the bump or a portion of the bump beyond the center along a drawing direction of the wire by using a part of the tool on a first electrode side; and deforming only a partial width of the bump, the tool being moved on the bump in a width direction of the bump while the part of the wire is bonded.

2. The method of manufacturing a semiconductor device as defined by claim 1, a part of the bump being deformed by the tool in bonding the part of the wire.

3. The method of manufacturing a semiconductor device as defined by claim 1, the tool being moved on the bump in the drawing direction of the wire in bonding the part of the wire.

4. The method of manufacturing a semiconductor device as defined by claim 1, bonding the part of the wire being performed while applying ultrasonic vibration to the bump.

5. The method of manufacturing a semiconductor device as defined by claim 1, the tool having a hole into which the wire is inserted, and a bonding being performed by using a part of an open end of the tool on the first electrode side in bonding the part of the wire.

6. The method of manufacturing a semiconductor device as defined by claim 1, before bonding the tip of the wire, further comprising:

bonding a tip of a second wire formed in a shape of a ball to the second electrode;

drawing a part of the second wire from the tip bonded to the second electrode;

forming the bump on the second electrode by deforming the second wire at a portion continuous with the tip on the tip; and cutting the second wire leaving the bump on the second electrode.

7. The method of manufacturing a semiconductor device as defined by claim 6, the top end of the bump being formed so that a height of the top end decreases in a direction toward an outside of the semiconductor device in forming the bump on the second electrode.

8. The method of manufacturing a semiconductor device as defined by claim 1, deforming only the partial width of the bump so that the deformed partial width of the bump is not before a center line of the bump in the drawing direction of the wire.

9. A method of manufacturing a semiconductor device, comprising:

bonding a tip of a wire to a first electrode by using a tool;

drawing the wire from the first electrode to a bump on a second electrode;

bonding a part of the wire to a center of the bump or a portion of the bump beyond the center along a drawing direction of the wire by using a part of the tool on a first electrode side; and deforming and pressing the wire over only a partial width of the bonding between the wire and the bump, the tool being moved on the bump in a width direction of the bump while the part of the wire is bonded.

10. The method of manufacturing a semiconductor device as defined by claim 9, part of the bump being deformed by the tool in bonding the part of the wire.

11. The method of manufacturing a semiconductor device as defined by claim 9, the tool being moved on the bump in the drawing direction of the wire in bonding the part of the wire.

12. The method of manufacturing a semiconductor device as defined by claim 9, bonding the part of the wire being performed while applying ultrasonic vibration to the bump.

13. The method of manufacturing a semiconductor device as defined by claim 9, the tool having a hole into which the wire is inserted, and a bonding being performed by using a part of an open end of the tool on the first electrode side in bonding the part of the wire.

14. The method of manufacturing a semiconductor device as defined by claim 9, before bonding the tip of the wire, further comprising:

bonding a tip of a second wire formed in a shape of a ball to the second electrode;

drawing a part of the second wire from the tip bonded to the second electrode;

forming the bump on the second electrode by deforming the second wire at a portion continuous with the tip on the tip; and cutting the second wire leaving the bump on the second electrode.

15. The method of manufacturing a semiconductor device as defined by claim 9, the top end of the bump being formed so that a height of the top end decreases in a direction toward an outside of the semiconductor device in forming the bump on the second electrode.

* * * * *